(12) United States Patent
Doyle et al.

(10) Patent No.: US 11,211,489 B2
(45) Date of Patent: Dec. 28, 2021

(54) LOW RESISTANCE FIELD-EFFECT TRANSISTORS AND METHODS OF MANUFACTURING THE SAME

(71) Applicant: Intel Corporation, Santa Clara, CA (US)

(72) Inventors: Brian Doyle, Portland, OR (US);
Abhishek Sharma, Hillsboro, OR (US);
Elijah Karpov, Portland, OR (US);
Ravi Pillarisetty, Portland, OR (US);
Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,793

(22) PCT Filed: Dec. 27, 2017

(86) PCT No.: PCT/US2017/068553
§ 371 (c)(1),
(2) Date: Mar. 25, 2020

(87) PCT Pub. No.: WO2019/132886
PCT Pub. Date: Jul. 4, 2019

(65) Prior Publication Data
US 2020/0235244 A1      Jul. 23, 2020

(51) Int. Cl.
*H01L 29/78* (2006.01)
*H01L 29/66* (2006.01)

(52) U.S. Cl.
CPC .... *H01L 29/78391* (2014.09); *H01L 29/6684* (2013.01); *H01L 29/7827* (2013.01)

(58) Field of Classification Search
CPC ..... H01L 23/552; H01L 23/66; H01L 23/481;
H01L 23/367; H01L 23/49816; H01L
2223/6683; H01L 2223/6627; H01L
2223/6616; H01L 23/3128; H01L
2924/15174; H01L 2224/18; H01L
23/5383; H01L 23/5384
(Continued)

(56) References Cited

U.S. PATENT DOCUMENTS 6,329,702 B1 * 12/2001 Gresham ............... H01L 21/486
257/623
6,940,111 B2 * 9/2005 Bruchhaus ............ H01L 23/552
257/295

(Continued)

OTHER PUBLICATIONS

International Search Report and Written Opinion from PCT/US2017/068553 notified Sep. 21, 2018, 14 pgs.

*Primary Examiner* — Sheikh Maruf
(74) *Attorney, Agent, or Firm* — Green, Howard & Mughal LLP

(57) ABSTRACT

Low resistance field-effect transistors and methods of manufacturing the same are disclosed herein. An example field-effect transistor disclosed herein includes a substrate and a stack above the substrate. The stack includes an insulator and a gate electrode. The example field-effect transistor includes a semiconductor material layer in a cavity in the stack. In the example field-effect transistor, a region of the semiconductor material layer proximate to the insulator is doped with a material of the insulator.

20 Claims, 10 Drawing Sheets

(58) Field of Classification Search
USPC ........................................................ 257/295
See application file for complete search history.

(56) References Cited

U.S. PATENT DOCUMENTS

| | | | | |
|---|---|---|---|---|
| 7,387,958 | B2* | 6/2008 | McCarroll | H01L 21/6835 257/621 |
| 7,825,440 | B1* | 11/2010 | Choudhury | H01L 23/66 257/275 |
| 2004/0041262 | A1* | 3/2004 | Okamoto | G06K 19/07718 257/737 |
| 2005/0116255 | A1* | 6/2005 | Kato | H01L 23/552 257/200 |
| 2006/0202291 | A1* | 9/2006 | Kolb | H01L 23/528 257/421 |
| 2007/0085121 | A1* | 4/2007 | Mikura | C04B 35/6261 257/295 |
| 2008/0061333 | A1* | 3/2008 | Hidaka | H01L 27/11502 257/295 |
| 2009/0251362 | A1* | 10/2009 | Margomenos | G01S 13/931 342/175 |
| 2014/0340952 | A1* | 11/2014 | Ramaswamy | G11C 11/223 365/51 |
| 2014/0346579 | A1* | 11/2014 | Franke | H01L 27/22 257/295 |
| 2015/0041873 | A1* | 2/2015 | Karda | H01L 29/24 257/295 |
| 2015/0221598 | A1* | 8/2015 | Lee | H01L 43/02 257/295 |
| 2015/0380343 | A1* | 12/2015 | Koontz | H01L 23/562 257/621 |
| 2016/0118404 | A1* | 4/2016 | Peng | H01L 27/1159 257/295 |
| 2016/0293557 | A1* | 10/2016 | Topak | H01L 23/5389 |
| 2016/0322368 | A1* | 11/2016 | Sun | H01L 27/1159 |
| 2017/0133383 | A1* | 5/2017 | Pandey | G11C 11/407 |
| 2018/0191051 | A1* | 7/2018 | Ndip | H01L 23/49827 |

* cited by examiner

LOW RESISTANCE FIELD-EFFECT TRANSISTORS AND METHODS OF MANUFACTURING THE SAME

CLAIM OF PRIORITY

This Application is a National Stage Entry of, and claims priority to, PCT Application No. PCT/US2017/068553, filed on Dec. 27, 2017 and titled "LOW RESISTANCE FIELD-EFFECT TRANSISTORS AND METHODS OF MANUFACTURING THE SAME", which is incorporated by reference in its entirety for all purposes.

FIELD OF THE DISCLOSURE

This disclosure relates generally to semiconductors and, more particularly, to low resistance field-effect transistors and methods of manufacturing the same

BACKGROUND

Some field-effect transistors (FETs) include a stack of alternating layers of gates and insulators disposed substantially perpendicular to a substrate. Current runs between a source and a drain of the FET along a semiconductor material disposed in a cavity defined by the layers of the stack.

Figure 1A:
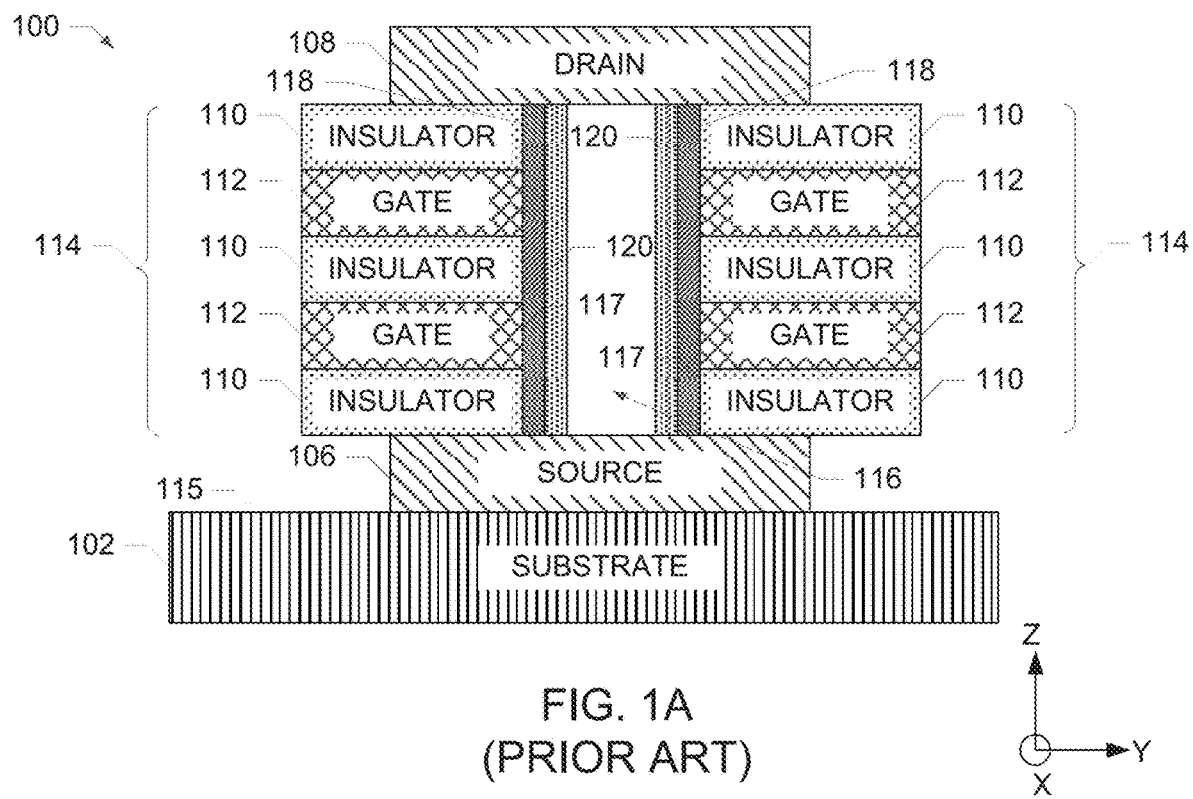
FIG. 1A is a cross-sectional view of a known vertically stacked field-effect transistor (FET).

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way above or on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

As used herein, the term "above" is used with reference to a substrate (e.g., a semiconductor wafer) on which components of an integrated circuit are formed. Specifically, as used herein, a first component of an integrated circuit is "above" a second component when the first component is farther away from the substrate when than the second component. Likewise, as used herein, a first component is "below" a second component when the first component is closer to the substrate than the second component. As noted above, one component can be above or below another with other components therebetween or while being in direct contact with one another.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

DETAILED DESCRIPTION

Disclosed herein are example field-effect transistor (FETs) and methods of making the same. Example FETs include dielectric or insulating layers made of borosilicate glass or phosphosilicate glass that are disposed between alternating layers of gate electrodes to form a vertical stack. During manufacture, example FETs are annealed or heated, which causes, for example, boron to diffuse out of the borosilicate glass insulator and into a semiconductor material extending along a channel defined in the vertical stack of the example FETs.

In known FETs including vertically stacked layers of gates and electrodes, regions of semiconducting material between the gates and proximate to the insulators add series resistance to the flow path of the current as current travels along the semiconductor material. Example FETs disclosed herein exhibit decreased resistance along a flow path of current via the semiconductor material of the FET as compared to known FETs including vertically stacked gate electrode and insulating layers. Before describing example FETs disclosed herein per teachings of this disclosure in detail, a brief description of a known FET is provided.

Figure 1B:
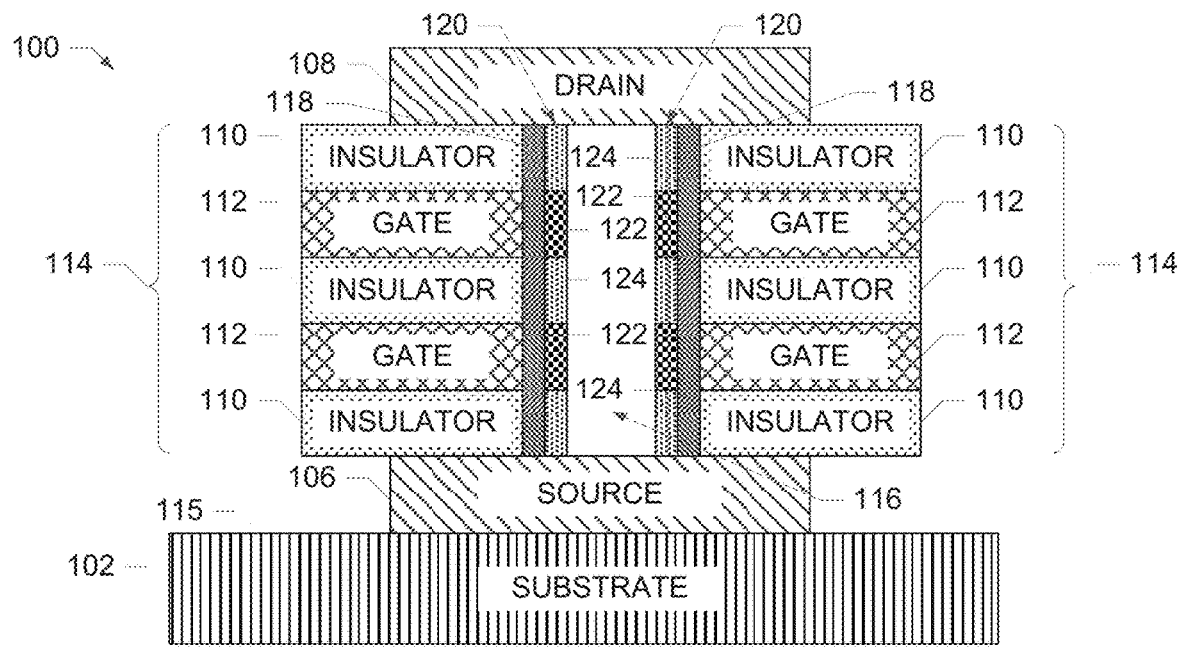
FIG. 1B illustrates the known FET of FIG. 1A after application of a voltage to the known FET.

The known vertical FET 100 of FIGS. 1A and 1B includes a multilayered structure formed on a substrate 102 (sometimes referred to as a substrate layer or base). The substrate 102 is formed of silicon (Si). The known FET 100 includes a source 106 and a drain 108. The known FET 100 of FIGS. 1A and 1B include alternating horizontal layers of insulators 110 and gate electrodes 112 forming a stack 114 between the source 106 and the drain 108. In this example, the stack 114 includes the layers 110, 112. The layers 110, 112 of the stack 114 are parallel to a top surface 115 of the substrate 102. The insulators 110 are made of a dielectric material such as silicon oxide ($SiO_x$). The gate electrodes 112 may be made of a conductive material such as polysilicon or metal.

In the known vertical FET 100 of FIGS. 1A and 1B, a cavity 116 extends through the stack 114. A sidewall 117 of the cavity 116 is defined by the insulators 110 and the gate electrodes 112. As illustrated in FIGS. 1A and 1B, the cavity 116 is disposed perpendicular to the substrate 102. In particular, the cavity 116 extends along a z-axis in an x-y-z coordinate system with the substrate 102 lying in the x-y plane. The cavity 116 may have, for example, a cylindrical shape, a rectangular shape, etc.

The known FET 100 of FIGS. 1A and 1B is a ferroelectric FET (FeFET) including a ferroelectric material layer 118 disposed in the cavity 116. In the known FET 100 of FIGS. 1A and 1B, the ferroelectric material layer 118 extends along the z-axis and is deposited in contact with the respective gate electrodes 112 and the insulators 110 forming the sidewall 117 of the cavity 116. The ferroelectric material layer 118 is made of a perovskite oxide.

The known FET 100 includes a semiconductor material layer 120 disposed in the cavity 116 and extending along the z-axis. In the known FET 100 of FIGS. 1A and 1B, the semiconductor material layer 120 is deposited in the cavity 116 on the ferroelectric material layer 118. The semiconductor material layer 120 is silicon or germanium (Ge). The source 106, the drain 108, and the gate electrodes 112 are coupled to contacts that enable current to flow from the source 106 to the drain 108 through the semiconductor material layer 120. The cavity 116 is filled with a dielectric material such as silicon dioxide ($SiO_2$).

FIG. 1B illustrates the known FeFET 100 after polarization of the ferroelectric material layer 118 by applying voltages via the contacts coupled to the gate electrode(s) 112. When one of the gate electrode(s) 112 is turned on, the polarization of the ferroelectric material layer 118 is inverted and the cavity 116 including the semiconductor material layer 120 becomes conductive. In the known FET 100, certain portions or regions 122 of the semiconductor material layer 118 proximate to the gate electrodes 112 become more conducting than other portions or regions 124 of the semiconductor material layer 118 proximate to the insulators 110, as represented by the different pattern assigned to the more-conducting portions 122 in FIG. 1B. The regions 124 of the semiconductor material layer 118 disposed proximate to the insulators 110 exhibit increased resistance as compared to the more-conducting regions 122 of the semiconductive layer 118 proximate to the gate electrodes 112.

As current flows through the semiconductor material layer 120 of the known FET 100 of FIGS. 1A and 1B, the current encounters the more-conducting regions 122 and the resistive regions 124 of the semiconductor material layer 120. The resistive regions 124 along the length of the semiconductor material layer 120 add series resistance to the known FET 100 between the source 106 and the drain 108. The series resistance due to the resistive regions 124 reduces the current flow through the semiconductor material layer 120 in accordance with the principle that voltage (V) equals the product of current (I) and resistance (R). In other words, V=IR. As a result, devices (e.g., NAND memory devices) including the known FET 100 of FIGS. 1A and 1B operate less efficiently due to reduced current flow. For example, time required to perform a read operation using a memory device including the known FET 100 is prolonged due to the decrease in current as a result of the less-conducting, resistive regions 124 of the semiconductor material layer 120.

Example FETs disclosed herein provide for decreased series resistance along a length of a semiconductor material layer disposed in a cavity of a stack including gate electrode layers and insulating layers as compared to the known FET 100. Example FETs disclosed herein replace the insulators 110 of the known FET 100 with borosilicate glass or phosphosilicate glass. Example FETs disclosed herein including, for example, borosilicate glass, are heated during manufacturing, which causes boron to diffuse out of the borosilicate glass and into the regions of the semiconductor material layer disposed proximate to the borosilicate glass layers. Boron is a known dopant for silicon. The doping of the regions of the semiconductor material layer proximate to the borosilicate glass layers substantially reduces the resistance in those regions and, thus, reduces the resistance of the example FETs as compared to the known FET 100. Example FETs disclosed herein may be used in any type of semiconductor devices for memory, logic, etc., such as 3D NAND memory devices.

Figure 2:
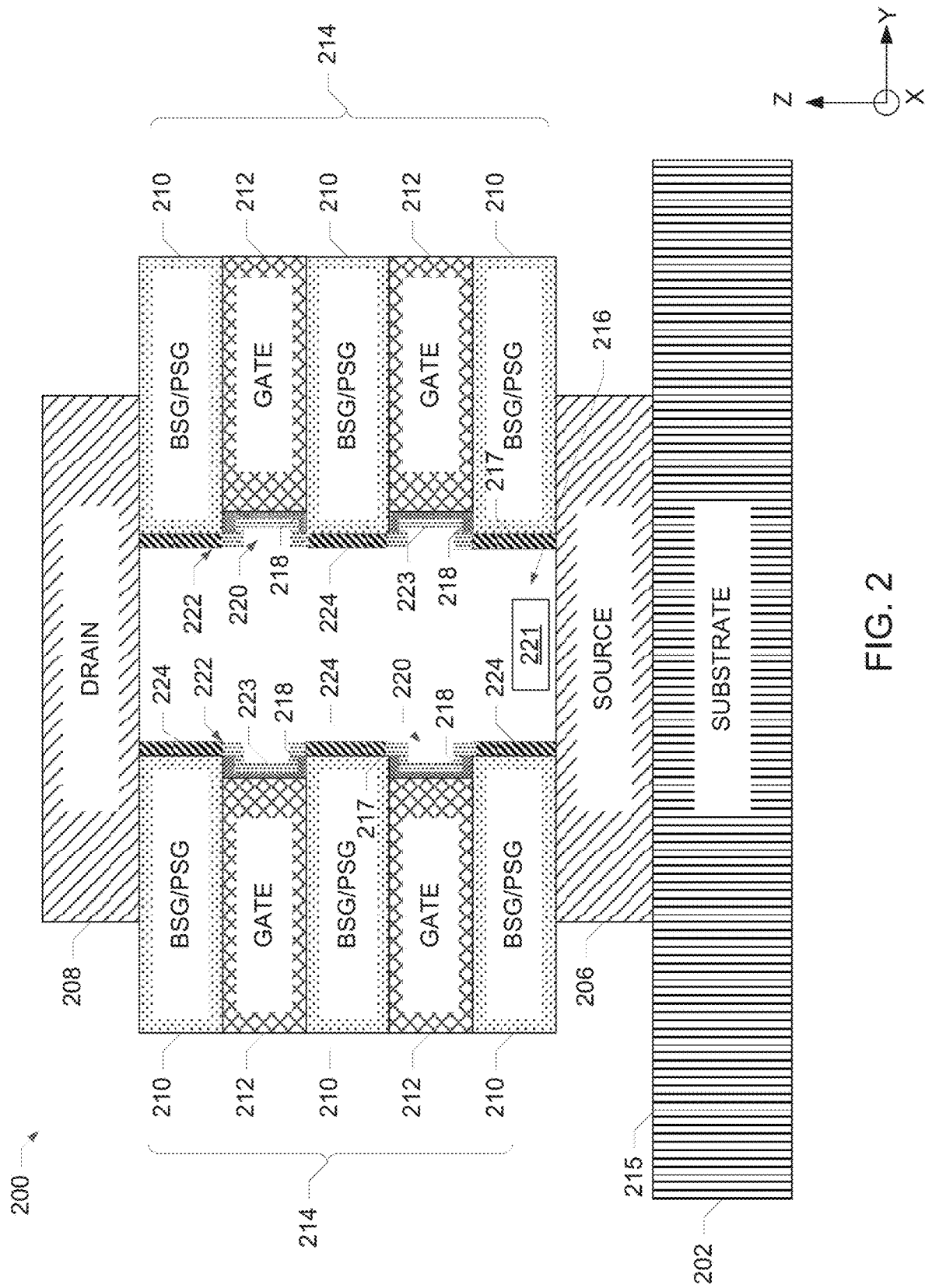
FIG. 2 is a cross-sectional view of an example FET constructed in accordance with teachings of this disclosure.

FIG. 2 is a cross-sectional view of an example FET 200 constructed in accordance with teachings of this disclosure. In FIG. 2, the components (e.g., regions, layers, etc.) of the example FET 200 are shown in different patterns or cross-hatchings for illustrative purposes. These patterns or cross-hatchings are not indicative of any particular material, but are merely used to help illustrate the different components and boundaries therebetween. If there is an exception to this rule of thumb, it will be specified for the affected structure. In the illustrated example, the FET 200 is a multi-layered structure including a substrate 202. In some examples, the substrate 202 includes silicon (Si). In other examples, the substrate 202 includes other suitable substrate materials.

In the illustrated example, the FET 200 includes a source 206 and a drain 208. The example FET 200 of FIG. 2 includes alternating layers of insulators 210 and gate electrodes 212 forming a stack 214 between the source 206 and the drain 208. In this example, the stack 214 includes the layers 210, 212. The layers 210, 212 are parallel to a top surface 215 of the substrate 202. The gate electrodes 212 may include a conductive material such as polysilicon or metal. In the example of FIG. 2, the insulators 210 include borosilicate glass (BSG) or phosphosilicate glass (PSG). The example FET 200 of FIG. 2 can include fewer or additional insulators 210 and/or gate electrodes 212 (e.g., 32 cells, 64 cells).

The example FET 200 of FIG. 2 includes a cavity 216 extending through the stack 214. The cavity 216 of the example FET 200 is defined by the insulators 210 and the gate electrodes 212. In the example vertical FET 200 of FIG. 2, the cavity 216 is disposed perpendicular to the substrate 102. As discussed herein, the cavity 216 can be defined by forming an opening in the layers of the stack 214. The cavity 216 can have, for example, a cylindrical shape, a rectangular shape, or an irregular shape. In the some examples, the example FET 200 of FIG. 2 has a macaroni or pipe shape. In the example of FIG. 2, a sidewall 217 of the cavity 216 is defined by the insulators 210 and gate electrodes 212.

The example FET 200 of FIG. 2 is a ferroelectric FET (FeFET) including ferroelectric material layers 218 disposed in the cavity 216. As discussed herein, the gate electrodes 212 may be etched via, for example, reactive-ion etching (RIE) to form recesses 220 in the stack 214 relative to the insulators 210 along the sidewall 217 of the cavity 216. In the example FET 200 of FIG. 2, the ferroelectric material layers 218 are disposed in the recesses 220 in contact with the gate electrodes 212. As discussed herein, in the example of FIG. 2, the ferroelectric material layers 218 are not disposed or are not substantially disposed along the insulators 210. This is in contrast to the known FET 100, where the ferroelectric material layer 118 extends along the insulators 110 and the gate electrode layers 112 in the cavity 116. Rather, in the example FET 200 of FIG. 2, the ferroelectric material layer 218 is only disposed in gate regions defined by the recesses 220. The ferroelectric material layer 218 can include, for example, perovskite oxide, doped hafnium dioxide (HFO$_2$), lead zirconate titanate (PZT), or bismuth ferrite (BiFeO$_3$).

The example FET 200 of FIG. 2 includes a semiconductor material layer 222 deposited in the cavity 216. The semiconductor material layer 222 extends along a length of the cavity 216 between the source 206 and the drain 208. In the example FET 200 of FIG. 2, the semiconductor material layer 222 is deposited on the insulators 210 and in the recesses 220 proximate to the gate electrodes 212. Put another way, the semiconductor material layer 222 substantially follows a profile (e.g., a cross-sectional profile) of the sidewall 217 of the cavity 216 defined by the insulators 210, the gate electrodes 212, and the recesses 220. Thus, the semiconductor material layer 222 includes first portions or regions 223 disposed proximate to the gate electrodes 212 and second portions or regions 224 disposed proximate to the insulators 210.

In the example of FIG. 2, the semiconductor material layer 222 includes silicon. In other examples, the semiconductor material layer 222 includes germanium. As discussed herein, the selection of the material for the insulators 110 as BSG or PSG may be based on the material of the semiconductor material layer 222. In examples in which the semiconductor material layer 222 includes silicon, BSG may be selected for the insulators 110 based on, for example, use of the boron as a known dopant for silicon (e.g., to form a p-type semiconductor). In examples in which the semiconductor material layer 222 includes germanium, PSG may be selected for the insulators 110 based on, for instance, known use of phosphorous as a dopant for germanium (e.g., to form an n-type semiconductor). In some other examples, the semiconductor material layer 222 includes silicon and the insulators 210 include PSG, where phosphorous in the PSG serves as a dopant for silicon. Thus, the example FET 200 of FIG. 2 can include BSG or PSG as an insulating material.

An interior of the cavity 216 can be filled with a dielectric material 221. The dielectric material 221 can include, for example, silicon dioxide (SiO$_2$) or silicon nitride (Si$_3$N$_4$).

In the example of FIG. 2, the second regions 224 of the semiconductor material layer 222 disposed proximate to (e.g., adjacent to) the insulators 210 are boron- or phosphorous-doped regions 224. In examples where the insulators 210 include BSG, the semiconductor material layer 222 includes boron-doped regions 224. In examples, where the insulators 210 include PSG, the semiconductor material layer 222 includes phosphorus-doped regions 224. As discussed herein, the boron- or phosphorous-doped regions 224 are formed as result of heating the FET 200 during manufacture. In examples in which the insulators 210 are made of BSG, heating the FET 200 causes boron to diffuse out of the BSG insulators 210 into the regions 224 of the semiconductor material layer 222 adjacent the insulators 210, thereby forming boron-doped regions 224. In examples in which the insulators 210 are made of PSG, heating the FET 200 causes phosphorus to diffuse out of the PSG insulators 210 into the regions 224 of the semiconductor material layer 222 adjacent the insulators 210, thereby forming phosphorous-doped regions 224. For example, the FET 200 of FIG. 2 may be heated in a Rapid Thermal Processing (RTP) furnace at temperatures from 400-700° C. to facilitate diffusion of boron or phosphorous from the insulators 210. Thus, after heating, the regions 224 of the semiconductor material layer 222 are doped with or include a material (e.g., boron or phosphorous) of the insulators 210. Also, after heating, the BSG or PSG retain their insulating properties. Thus, after heating, the example FET 200 of FIG. 2 includes the insulators 210 and the boron- or phosphorous-doped regions 224 of the semiconductor material layer 222.

In the example FET 200 of FIG. 2, the doping of the regions 224 of the semiconductor material layer 222 proximate to (e.g., adjacent to) the insulators 210 with boron or phosphorous reduces a resistance of the semiconductor material layer 222 in those regions as compared to the resistive regions 124 of the semiconductor material layer 118 in the known FET 100 of FIGS. 1A and 1B (i.e., as compared to the portions of the semiconductor material layer 118 proximate to the insulators 110 of the known FET 100). When the gate electrodes 212 of the example FET 200 of FIG. 2 are activated, the FET 200 includes (a) conducting regions 223 corresponding to the portions of the semiconductor material layer 222 that are proximate to the gate electrodes 212 and the ferroelectric material layers 218 and (b) low resistance, conducting regions 224 corresponding to the portions of the semiconductor material layer 222 that are proximate to the insulators 210 and that have been doped with boron or phosphorus from the insulators 210 as a result of the heating of the FET 200 during manufacture. Thus, current flowing through the semiconducting material layer 222 of example FET 200 of FIG. 2 encounters less resistance as compared to current flowing through the semiconductor material layer 120 of the known FET 100 of FIGS. 1A and 1B, which encounters the resistive regions 124 along the current flow path. Therefore, the example FET 200 of FIG. 2 exhibits reduced resistance and improved current flow over known FETs, which can increase operational efficiency of devices including the example FET 200. Further, the example FET 200 of FIG. 2 enables more layers of gate electrodes 212 and insulators 210 to be stacked vertically because of the reduction in series resistance of the stack 214 between the source 206 and the drain 208 than known FETs.

In the example FET 200 of FIG. 2, the resistive regions of known FETs have been replaced with less resistive regions 224 due to the doping of the semiconductor material layer 222 with boron or phosphorous from the dielectric layers. As mentioned herein, the example FET 200 of FIG. 2 includes the recesses 220 formed at the gate electrodes 212 between the insulators 210. The ferroelectric material layers 218 are disposed in the recesses 220 and are not disposed (or substantially missing) along the portions or sides of the insulators 210 facing the cavity 216. Thus, in the example of FIG. 2, the semiconductor material layer 222 can be in direct contact with the insulators 210, as compared to the known FET 100 of FIGS. 1A and 1B, in which the ferroelectric material layer 118 is disposed between the insulators 110 and the semiconductor material layer 120. As a result, during heating of the example FET 200 of FIG. 2, boron or phosphorous from the BSG or PSG insulators 210 can directly diffuse or be inserted into the regions 224 of the semiconductor material layer 222 deposited in the cavity 216 at the insulators 210.

Although the example FET 200 includes the vertical stack 214 of insulators 210 and gate electrodes 212, examples disclosed herein are not limited to vertically stacked FETs but could be implemented in, for example, FETs including in-plane or horizontally configured gates electrodes and semiconductor materials. Also, although examples disclosed herein are discussed in connection with FeFETs, examples disclosed herein are not limited to use with FeFETs.

FIGS. 3A-3G are detailed cross-sectional views depicting the example FET 200 of FIG. 2A at different stages of manufacture. The example processes shown in these figures are only examples and any appropriate sequence of fabrication processes such as etching, deposition, epitaxial growth, etc. may be used. Further, any appropriate materials, layers, stacks, and/or conductors may be used.

Figure 3A:
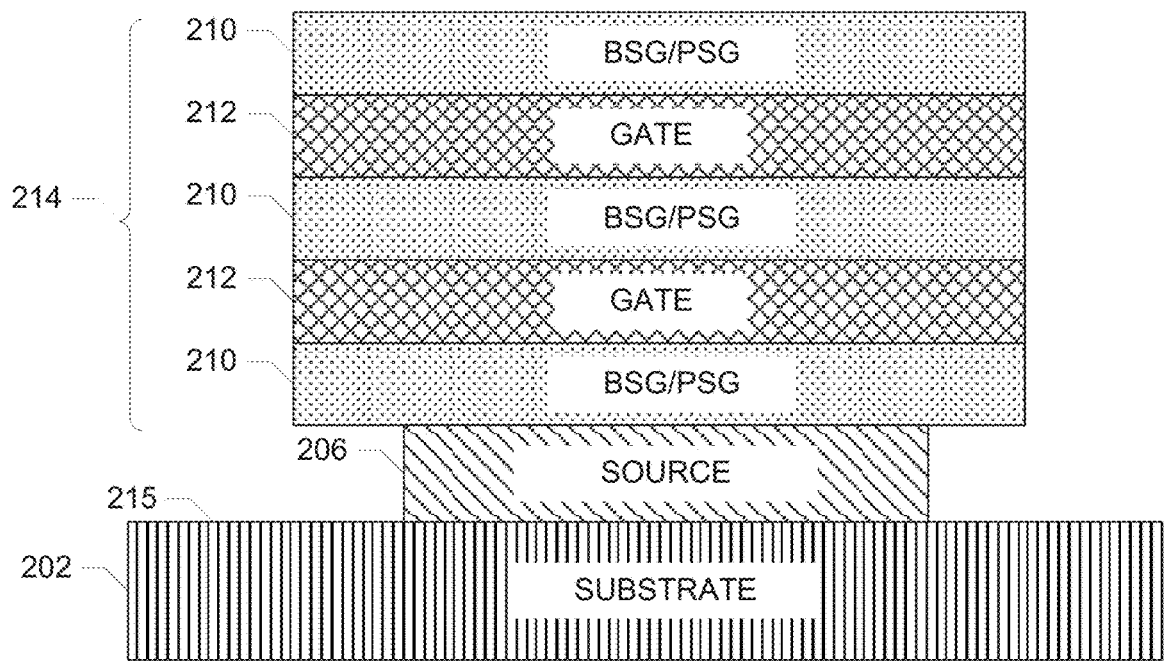
FIGS. 3A-3G illustrate the example FET of FIG. 2 at different times/stages of fabrication.

Turning to FIG. 3A, a source 206 is formed on the substrate 202 via, for example a growth process such as epitaxial growth. As also shown in FIG. 3A, the stack 214 of alternating layers including the insulators 210 and the gate electrodes 212 is formed on top of the source 206. In the example of FIG. 3A, the insulators 210 include borosilicate glass (BSG) or phosphosilicate glass (PSG). In some examples, the selection of the insulators 210 as including BSG or PSG is based on a material of a semiconductor layer to be used with the example FET 200 of FIG. 3A (e.g., silicon or germanium). The vertical stack 214 can be formed by depositing the insulators 210 and the gate electrodes using deposition techniques such as, for example, chemical vapor deposition (CVD), atomic layer deposition (ALD), etc.

Figure 3B:
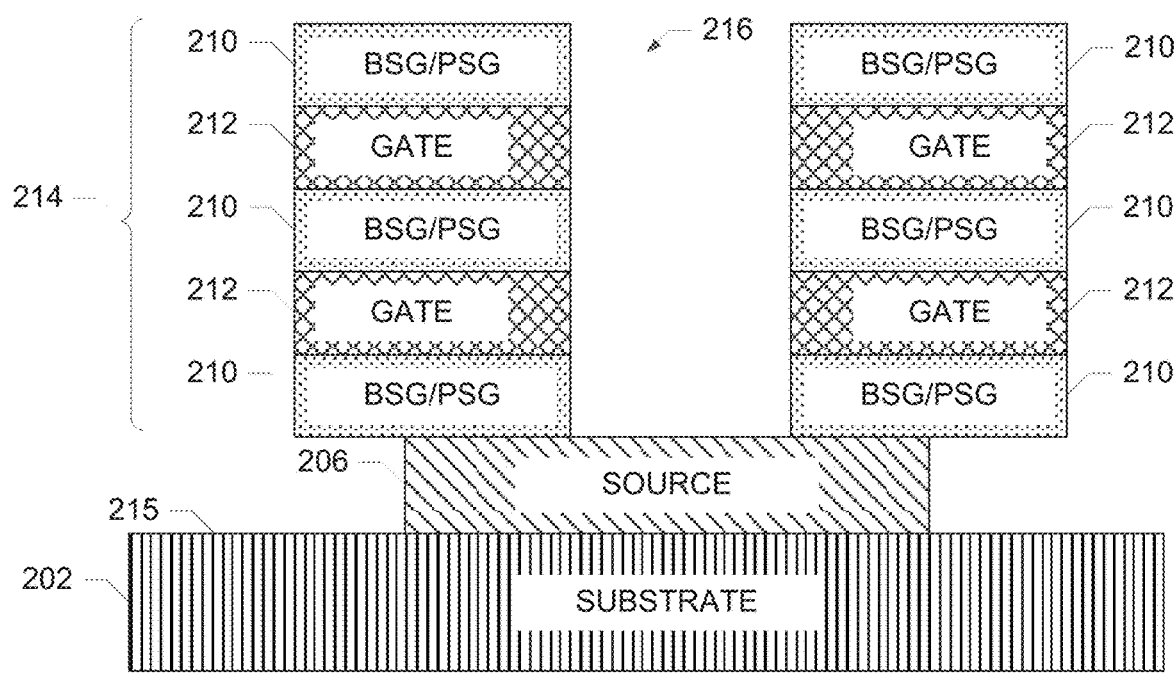

Subsequently, as illustrated in FIG. 3B, the cavity 216 is formed through the stack 214. In this example, the cavity 216 is formed in the stack 216 in a direction perpendicular to the top surface 215 of the substrate 202. The cavity 216 may be formed through the stack 214 via etching. As illustrated in FIG. 3B, the sidewall 217 of the cavity 216 is defined by the sides of the insulators 210 and the gate electrodes 217 resulting from the formation of the cavity 216 through the stack 214. In some examples, a cylindrical or pillar-shaped structure is punched through the stack 214 to form at least a portion of the cavity 216. The cavity 216 may have other cross-sectional shapes than illustrated in FIG. 3B and may include, for example, portions have differing widths along a length of the channel. For example, the sidewall 217 of the cavity 216 may be formed at an angle relative to the insulators 210 and the gate electrodes 212 resulting in tapering of a width of the cavity 216 to a narrowest point proximate to the source 206.

Figure 3C:
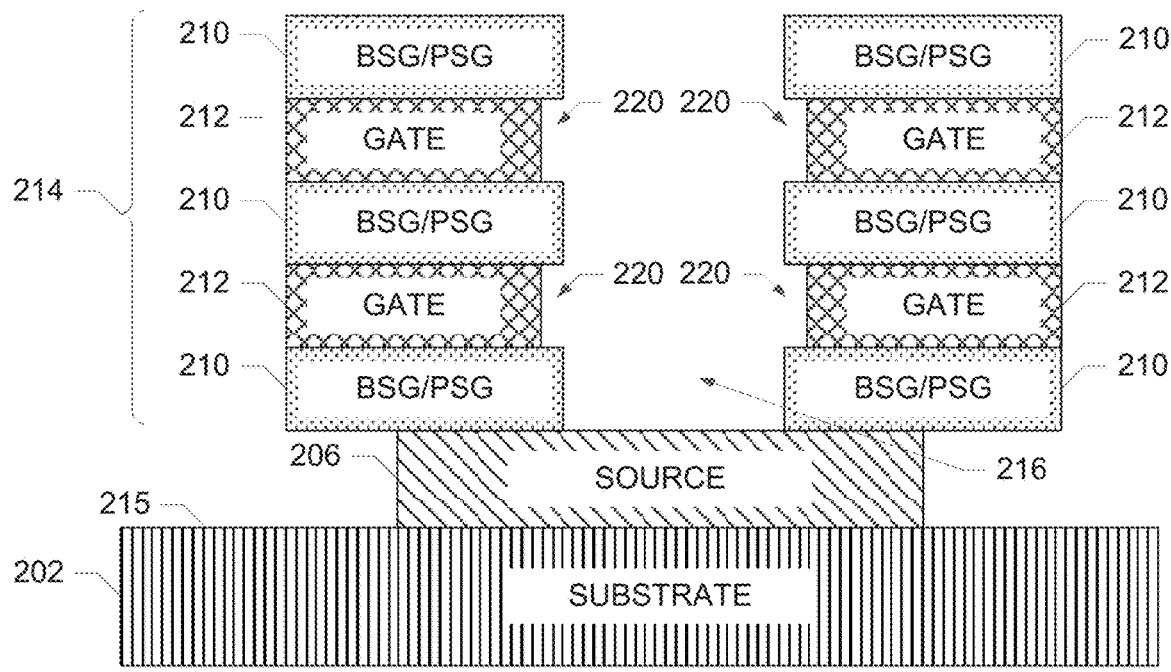

As illustrated in FIG. 3C, recesses 220 are formed in the stack 214 at the gate electrodes 212 between each of the insulators 210. The recesses 220 may be formed via, for example, reactive-ion etching (RIE) of the gate electrodes 212. The recesses 220 can have different shapes and or sizes than the example shown in FIG. 3C (e.g., curved or partially curved). The shapes and/or sizes may be based on the etching pattern for the gate electrodes 212. Thus, a vertical cross-sectional profile of the cavity 216 (e.g., having indented portions at the sidewall 217 of the cavity 216 defined by the recesses 220) may differ from the example of FIGS. 3B and 3C as a result of the formation of the recesses 220.

Figure 3D:
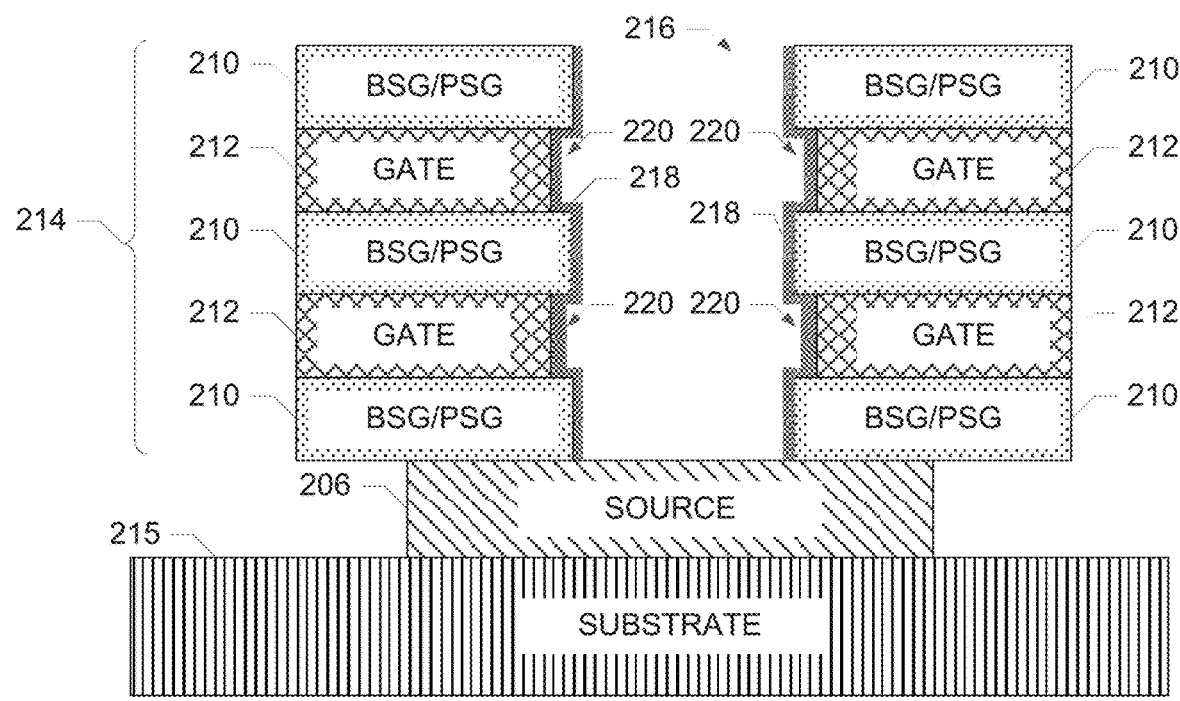

Referring now to FIG. 3D, the ferroelectric material layer 218 is deposited in the cavity 216 proximate to (e.g. in contact with) the insulators 210 and the gate electrodes 212. The ferroelectric material layer 218 may be deposited via CVD or another deposition technique. As illustrated in FIG. 3D, the ferroelectric material layer 218 is deposited in the recesses 220 and along the sides of the insulators 210 facing the cavity 216.

Figure 3E:
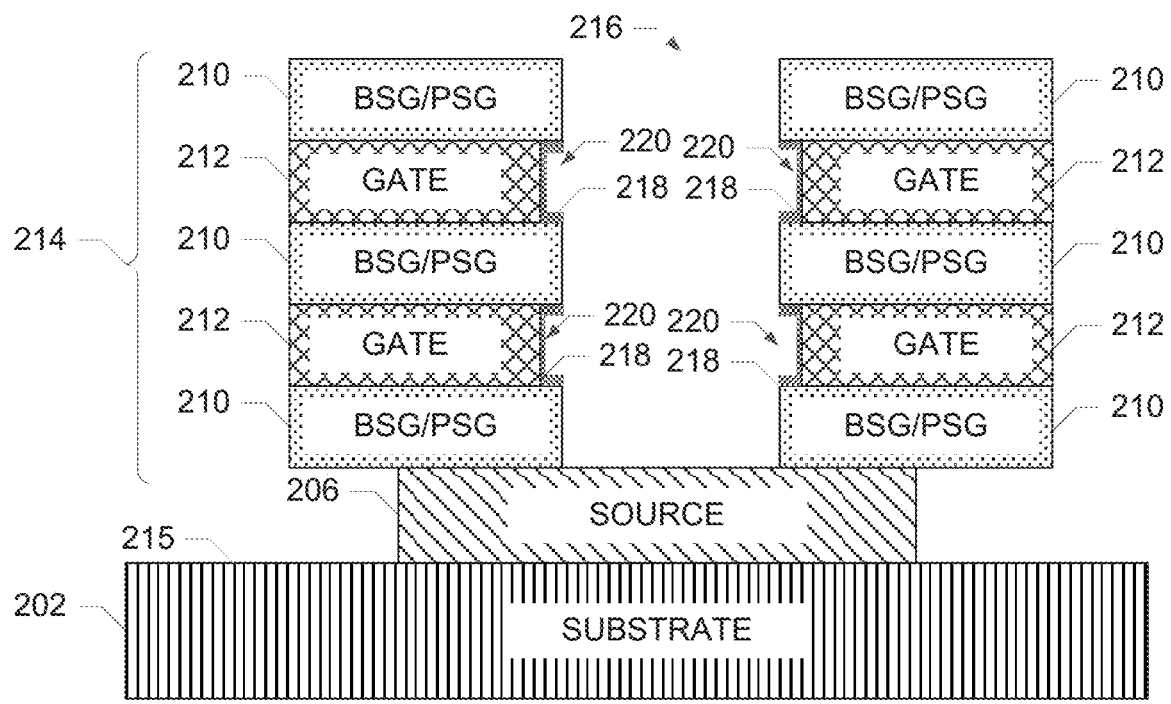

Subsequently, as illustrated in FIG. 3E, the portions of the ferroelectric material layer 218 that are deposited proximate to the insulators 210 are removed so that only the recesses 200 include the ferroelectric material. The portions of ferroelectric material layer 218 can be selectively removed from the dielectric layer regions via directional etching. After etching, the ferroelectric material is deposited in the recesses 220 at the gate regions of the stack 214. In some examples, portions of the ferroelectric material may be adjacent the BSG or PSG layer 210.

Figure 3F:
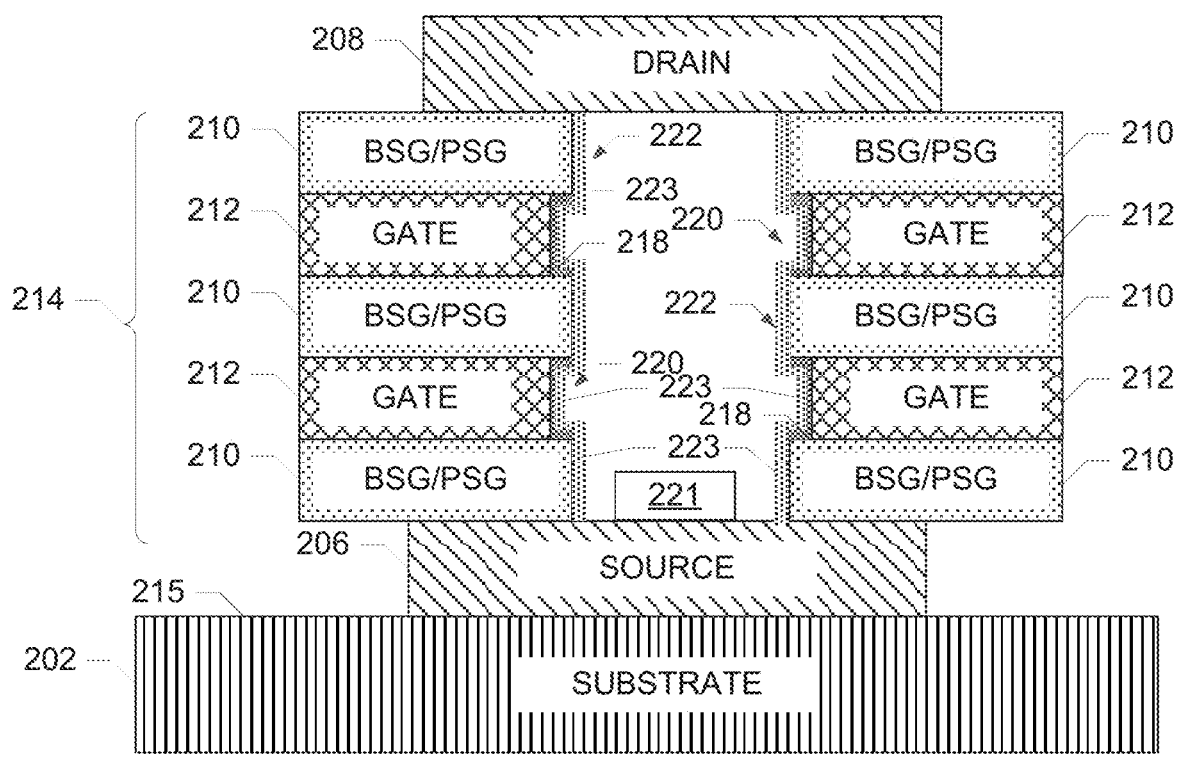

Next, as illustrated in FIG. 3F, the semiconductor material layer 222 is deposited in the cavity 216. In the example of FIG. 3, semiconductor material layer 222 is deposited in the cavity 216 along sides of the insulators 210 facing the cavity 216 and in the recesses 220. In some examples, the semiconductor material layer 222 is in contact with the ferroelectric material layers 218 in the recesses 220. The semiconductor material may be deposited via CVD, ALD, or another deposition technique. Thus, in the example of FIG. 3F, some regions 224 of the semiconductor material layer 222 are deposited on the insulators 210 and other regions 223 of the semiconductor material layer 222 are deposited on the ferroelectric material layers 218 in the recesses 220 proximate to the gate electrodes 212. The semiconductor material layer 222 is coupled to the source 206. The semiconductor material layer 222 may be made of, for example, silicon or germanium. In examples in which the semiconductor material layer 222 is silicon, the insulators 210 may have been selected as BSG (e.g., at the stage of manufacture shown in FIG. 3A). In examples in which the semiconductor material layer 222 is germanium, the insulators 210 may include PSG (e.g., at the stage of manufacture shown in FIG. 3A).

As illustrated in FIG. 3F, the cavity 216 (i.e., a remainder of the channel defined by the semiconductor material layer 222) is filled with a dielectric material 221 (e.g., silicon dioxide). As also illustrated in FIG. 3F, the drain 208 is formed at an end of the vertical stack 214 opposite the source 206. The vertical stack 214 extends between the source 206 and the drain 208. The drain may be formed via, for example, an epitaxial growth process. The semiconductor material layer 222 is coupled to the drain.

Figure 3G:
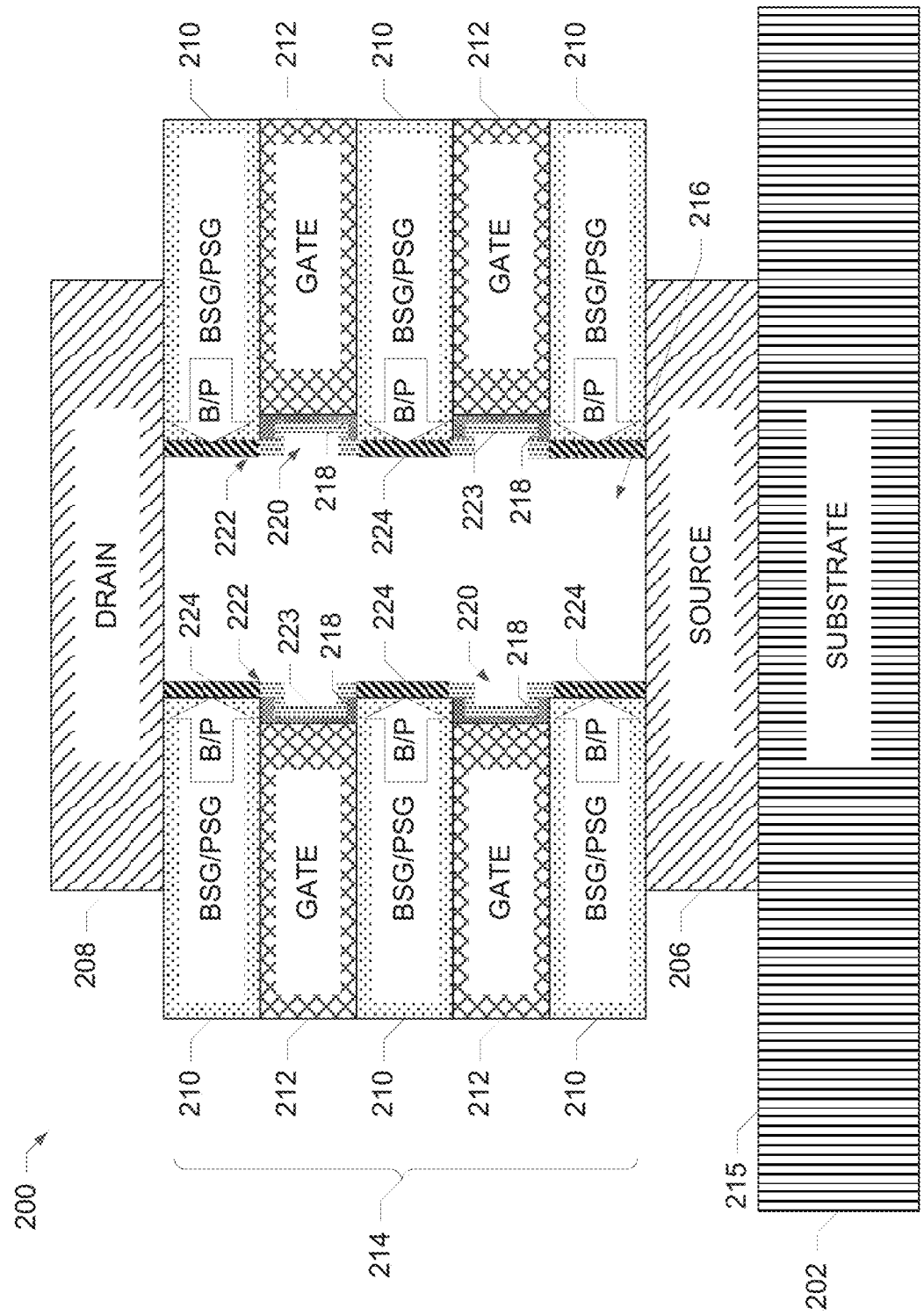

Subsequently, the example FET 200 of FIG. 3F is annealed. For example, the FET 200 can be placed in a furnace and heated via rapid thermal processing at 400°-700° C. As illustrated in FIG. 3G, in examples in which the insulators 210 include BSG, heating the FET 200 causes boron to diffuse out of the BSG dialectic layers 210 and into the region 224 of the semiconductor material layer 222 disposed proximate to the insulators 210. As also illustrated in FIG. 3G, in examples in which the insulators 210 include PSG, heating the FET 200 causes phosphorus to diffuse out of the PSG dialectic layers 210 and into the regions 224 of the semiconductor material layer 222 disposed proximate to the insulators 210. Thus, the regions 224 of the semiconductor material layer are doped by either boron or phosphorous. Accordingly, after heating, the regions 224 of the semiconductor material layer 222 are doped with or include a material from the insulators 210 (e.g., boron or phosphorous). As discussed above, as a result of the diffusion of boron from the BSG insulators 210 or phosphorous from the PSG insulators 210, the resistance of the semiconductor material layer 222 at the regions 224 adjacent to the insulators 210 is substantially reduced as compared to the regions 124 proximate to the insulators 110 in the known FET 100 of FIGS. 1A and 1B.

Figure 4:
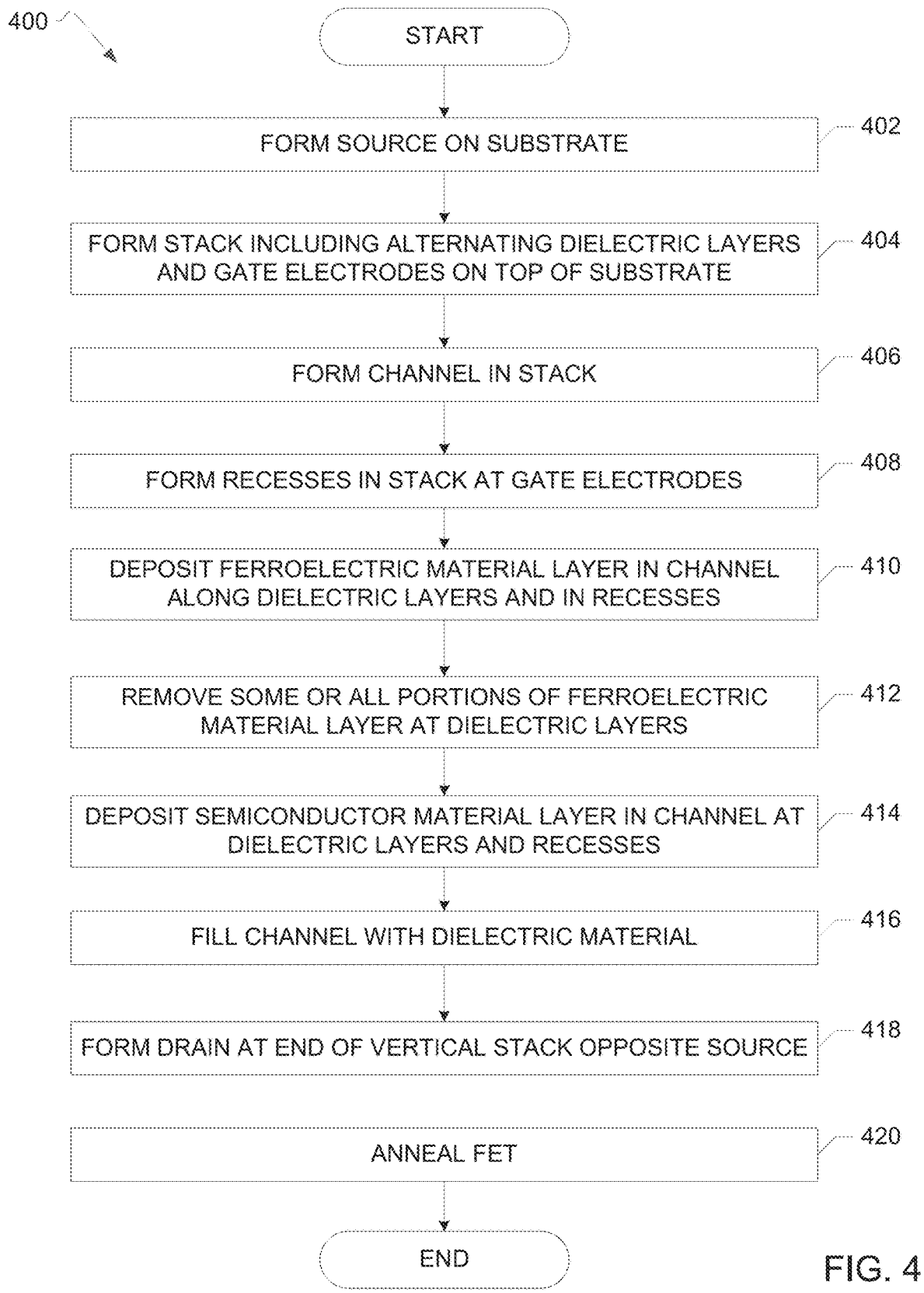
FIG. 4 is a flowchart of an example method to manufacture the FET of FIG. 2.

FIG. 4 is a flowchart of an example method 400 to manufacture the example FET 200 of FIG. 2 and described in connection with the process illustrated in FIGS. 3A-3G.

At block 402, the source 206 is formed on the substrate 202. At block 404, the stack 214 including alternating insulators 210 and gate electrodes 212 are formed on top of the substrate 202 (e.g., above the top surface 215 of the substrate 202) and perpendicular to the substrate 202, as depicted in FIG. 3A. The insulators 210 may include BSG or PSG.

At block 406, the cavity 216 is formed in the stack 214 via, for example, etching. At block 408, the recesses 220 are formed in the stack 214 at the gate electrodes 212. The recesses 220 may be formed by etching the gate electrodes 212 via, for example, reactive-ion etching. As a result of the formation of the recesses 220, the gate electrodes 212 are indented relative to the insulators 210 in the cavity 216, as illustrated in FIG. 3C.

At block 410, the ferroelectric material layer 218 is deposited in the cavity 216 on the insulators 210 and in the recesses 220. The ferroelectric material layer 218 can be deposited via, for example, CVD. The ferroelectric material layer 218 can include, for example, perovskite oxide, doped hafnium dioxide ($HFO_2$), lead zirconate titanate (PZT), and/or bismuth ferrite ($BiFeO_3$). At block 412, the portions of ferroelectric material layer 218 proximate to the insulators 210 are removed. The portions of ferroelectric material layer 218 proximate to the insulators 210 may be removed using, for example, directional etching. After the directional etching, the ferroelectric material layers 218 are disposed in the recesses 220 but are not disposed along the insulators 210 in the cavity 216, as illustrated in FIG. 3E. In some examples, the residual amounts of the ferroelectric material 218 may remain on some of the insulators 210 after etching.

At block 414, the semiconductor material layer 222 is deposited in the cavity 216 on the insulators 210 and in the recesses 220, as illustrated in FIG. 3F. The semiconductor material layer 222 may be, for example, silicon or germanium. At block 416, the cavity 216 is filled with a dielectric material 221, such silicon dioxide ($SiO_2$), silicon nitride ($Si_3N_4$), etc. At block 418, the drain 208 is formed on top of the stack 214, as illustrated in FIG. 3F.

At block 420, the FET 200 of FIGS. 3A-3F is annealed by heating in, for example, an RTP furnace. As discussed above, when the FET 200 is heated, boron diffuses out of the BSG insulators 210 into the regions 224 of the semiconductor material layer 222 proximate to (e.g., deposited on) the BSG insulators 210. As also discussed above, when the insulators 210 include PSG instead of BSG, phosphorous diffuses out of the PSG insulators 210 and into the regions 224 of the semiconductor material layer 222 proximate to (e.g., deposited on) the PSG insulators 210. Thus, as a result of heating, the regions 224 of the semiconductor material layer 222 are doped with a material of the insulators 210 (e.g., boron or phosphorous). The example FET 200 is cooled as part of the annealing. Thereafter, the example method 400 of FIG. 4 ends.

Although the example method 400 is described with reference to the flowchart illustrated in FIG. 4, many other methods of manufacturing the example FET 200 of FIG. 2 may alternatively be used. For example, the order of execution of the blocks may be changed, and/or some of the blocks described may be changed, eliminated, or combined. Similarly, additional operations may be included in the manufacturing process before, in between, or after the blocks shown in FIG. 4

The example FET 200 disclosed herein may be included in any suitable electronic component. FIGS. 5-9 illustrate various examples of apparatus that may include any of the example FETs disclosed herein.

Figure 5:
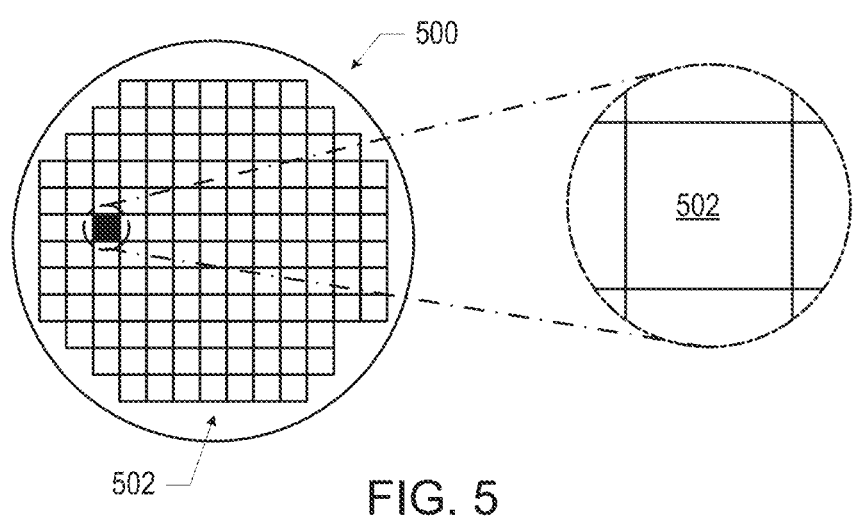
FIG. 5 is a top view of a wafer and dies that may include such as the example FET of FIG. 2, in accordance with any of the examples disclosed herein.

FIG. 5 is a top view of a wafer 500 and dies 502 that may include one or more of the example FET(s) 200, or may be included in an IC package whose substrate includes one or more of the example FET(s) 200 (e.g., as discussed below with reference to FIG. 7) in accordance with any of the examples disclosed herein. The wafer 500 may be composed of semiconductor material and may include one or more dies 502 having IC structures formed on a surface of the wafer 500. Each of the dies 502 may be a repeating unit of a semiconductor product that includes any suitable IC. After the fabrication of the semiconductor product is complete, the wafer 500 may undergo a singulation process in which the dies 502 are separated from one another to provide discrete "chips" of the semiconductor product. The die 502 may include one or more of the example FET(s) 200 (e.g., as discussed below with reference to FIG. 6), one or more transistors (e.g., some of the transistors 640 of FIG. 6, discussed below) and/or supporting circuitry to route electrical signals to the transistors, as well as any other IC components. In some examples, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device (e.g., the processing device 502 of FIG. 5) or other logic that is configured to store information in the memory devices or execute instructions stored in the memory array.

Figure 6:
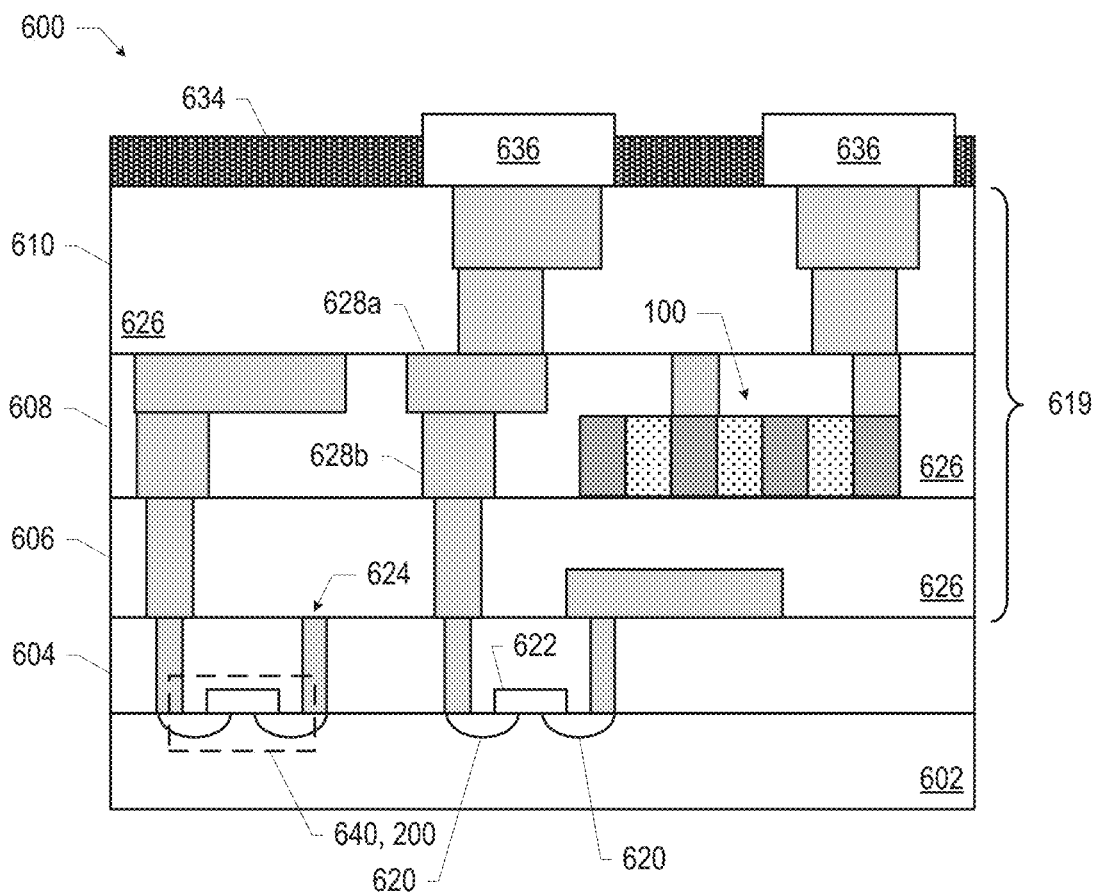
FIG. 6 is a cross-sectional side view of an IC device that may include a transistor such as an FET, such as the example FET 200 of FIG. 2, in accordance with any of the examples disclosed herein.

FIG. 6 is a cross-sectional side view of an IC device 600 that may include one or more of the example FET(s) 200, or may be included in an IC package whose substrate includes one or more of the example FET(s) 200 (e.g., as discussed below with reference to FIG. 7), in accordance with any of the examples disclosed herein. One or more of the IC devices 600 may be included in one or more dies 502 (FIG. 5). The IC device 600 may be formed on a substrate 602 (e.g., the wafer 500 of FIG. 5) and may be included in a die (e.g., the die 502 of FIG. 5). The substrate 602 may be a semiconductor substrate composed of semiconductor material systems including, for example, n-type or p-type materials systems (or a combination of both). The substrate 602 may include, for example, a crystalline substrate formed using a bulk silicon or a silicon-on-insulator (SOI) substructure. In some examples, the substrate 602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 602. Although a few examples of materials from which the substrate 602 may be formed are described here, any material that may serve as a foundation for an IC device 600 may be used. The substrate 602 may be part of a singulated die (e.g., the dies 502 of FIG. 5) or a wafer (e.g., the wafer 500 of FIG. 5).

The IC device 600 may include one or more device layers 604 disposed on the substrate 602. The device layer 604 may include features of one or more transistors 640 (e.g., metal oxide semiconductor field-effect transistors (MOSFETs)) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 640 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 620 may be formed within the substrate 602 adjacent to the gate 622 of each transistor 640. The S/D regions 620 may be formed using an implantation/diffusion process or an etching/deposition process, for example. In the former process, dopants such as boron, aluminum, antimony, phosphorous, or arsenic may be ion-implanted into the substrate 602 to form the S/D regions 620. An annealing process that activates the dopants and causes them to diffuse farther into the substrate 602 may follow the ion-implantation process. In the latter process, the substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 620 may be formed using one or more alternate semiconductor materials such as germanium or a group III-V material or alloy. In further examples, one or more layers of metal and/or metal alloys may be used to form the S/D regions 620.

In some examples, the device layer 604 may include one or more of the example FET(s) 200, in addition to or instead of transistors 640. FIG. 6 illustrates a single FET 200 in the device layer 604 for illustration purposes, but any number and structure of the example FET 200 may be included in a device layer 604. The example FET 200 included in a device layer 604 may be referred to as a "front end" device. In some examples, the IC device 600 may not include any front end FET 200. One or more of the example FET(s) in the device layer 604 may be coupled to any suitable other ones of the devices in the device layer 604, to any devices in the metallization stack 619 (discussed below), and/or to one or more of the conductive contacts 636 (discussed below).

Electrical signals, such as power and/or input/output (I/O) signals, may be routed to and/or from the devices (e.g., transistors 640 and/or the example FET(s) 200 of FIG. 2) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an ("ILD stack") 619 of the IC device 600. In some examples, one or more of the example FET(s) may be disposed in one or more of the interconnect layers 606-610, in accordance with any of the techniques disclosed herein. FIG. 6 illustrates a single FET 200 in the interconnect layer 608 for illustration purposes, but any number and structure of the example FET(s) 200 may be included in any one or more of the layers in a metallization stack 619. The example FET 200 included in the metallization stack 619 may be referred to as a "back-end" device. In some examples, the IC device 600 may not include any back-end FET(s) 200; in some examples, the IC device 600 may include both front- and back-end FET(s) 200. One or more of the example FET(s) in the metallization stack 619 may be coupled to any suitable ones of the devices in the device layer 604, and/or to one or more of the conductive contacts 636 (discussed below).

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, examples of the present disclosure include IC devices having more or fewer interconnect layers than depicted.

In some examples, the interconnect structures 628 may include lines 628*a* and/or vias 628*b* filled with an electrically conductive material such as a metal. The lines 628*a* may be arranged to route electrical signals in a direction of a plane that is substantially parallel with a surface of the substrate 602 upon which the device layer 604 is formed. For example, the lines 628*a* may route electrical signals in a direction in and out of the page from the perspective of FIG. 10. The vias 628*b* may be arranged to route electrical signals in a direction of a plane that is substantially perpendicular to the surface of the substrate 602 upon which the device layer 604 is formed. In some examples, the vias 628*b* may electrically couple lines 628*a* of different interconnect layers 606-610 together.

The interconnect layers 606-610 may include a dielectric material 626 disposed between the interconnect structures 628, as shown in FIG. 6. In some examples, the dielectric material 626 disposed between the interconnect structures 628 in different ones of the interconnect layers 606-610 may have different compositions; in other examples, the composition of the dielectric material 626 between different interconnect layers 606-610 may be the same.

A first interconnect layer 606 (referred to as Metal 1 or "M1") may be formed directly on the device layer 604. In some examples, the first interconnect layer 606 may include lines 628*a* and/or vias 628*b*, as shown. The lines 628*a* of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some examples, the second interconnect layer 608 may include vias 628*b* to couple the lines 628*a* of the second interconnect layer 608 with the lines 628*a* of the first interconnect layer 606. Although the lines 628*a* and the vias 628*b* are structurally delineated with a line within each interconnect layer (e.g., within the second interconnect layer 608) for the sake of clarity, the lines 628*a* and the vias 628*b* may be structurally and/or materially contiguous (e.g., simultaneously filled during a dual-damascene process) in some examples.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some examples, the interconnect layers that are "higher up" in the metallization stack 619 in the IC device 600 (i.e., further away from the device layer 604) may be thicker.

The IC device 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to other external devices. For example, solder bonds may be formed on the one or more conductive contacts 636 to mechanically and/or electrically couple a chip including the IC device 600 with another component (e.g., a circuit board). The IC device 600 may include additional or alternate structures to route the electrical signals from the interconnect layers 606-610; for example, the conductive contacts 636 may include other analogous features (e.g., posts) that route the electrical signals to external components.

Figure 7:
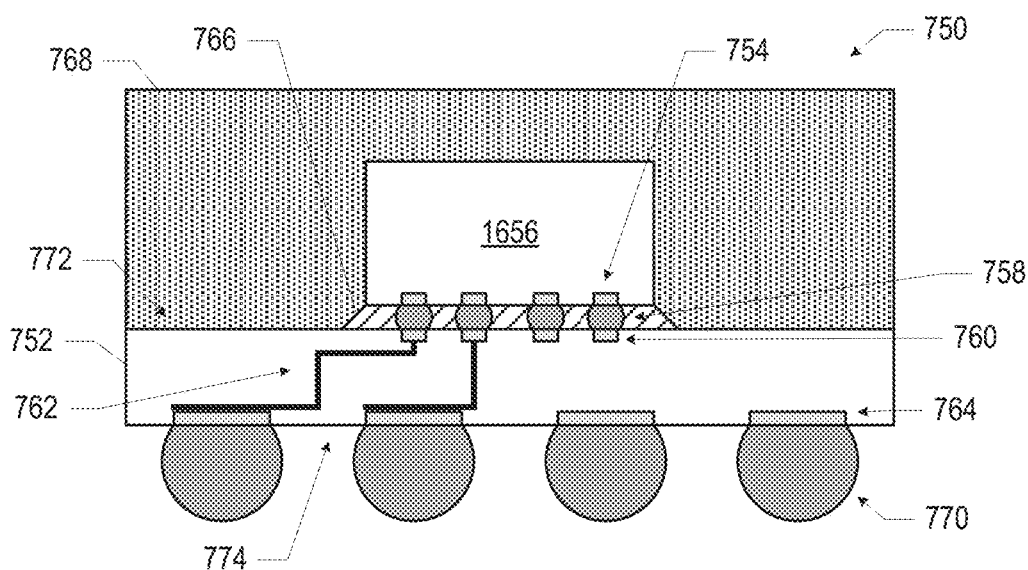
FIG. 7 is a cross-sectional side view of an IC package that may include a FET, such as the example FET of FIG. 2, in accordance with any of the examples disclosed herein.

FIG. 7 is a cross-sectional view of an example IC package 650 that may include one or more of the example FETs 200. The package substrate 752 may be formed of a dielectric material, and may have conductive pathways extending through the dielectric material between the face 772 and the face 774, or between different locations on the 772, and/or between different locations on the face 774. These conductive pathways may take the form of any of the interconnects 728 discussed above with reference to FIG. 6. FIG. 7 illustrates a single FET 200 in the package substrate 752, but this number and location of the FETs 200 in the IC package 650 is simply illustrative, and any number of the example FETs 200 (with any suitable structure) may be included in a package substrate 752. In some examples, no FETs 200 may be included in the package substrate 752.

The IC package 750 may include a die 756 coupled to the package substrate 752 via conductive contacts 754 of the die 756, first-level interconnects 758, and conductive contacts 760 of the package substrate 752. The conductive contacts 760 may be coupled to conductive pathways 762 through the package substrate 652, allowing circuitry within the die 756 to electrically couple to various ones of the conductive contacts 764 or to the example FETs 200 (or to other devices included in the package substrate 752, not shown). The first-level interconnects 758 illustrated in FIG. 7 are solder bumps, but any suitable first-level interconnects 758 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 766 may be disposed between the die 756 and the package substrate 752 around the first-level interconnects 758, and a mold compound 768 may be disposed around the die 756 and in contact with the package substrate 752. In some examples, the underfill material 766 may be the same as the mold compound 768. Example materials that may be used for the underfill material 766 and the mold compound 768 are epoxy mold materials, as suitable. Second-level interconnects 770 may be coupled to the conductive contacts 764. The second-level interconnects 770 illustrated in FIG. 7 are solder balls (e.g., for a ball grid array arrangement), but any suitable second-level interconnects 770 may be used (e.g., pins in a pin grid array arrangement or lands in a land grid array arrangement). The second-level interconnects 770 may be used to couple the IC package 750 to another component, such as a circuit board (e.g., a motherboard), an interposer, or another IC package, as known in the art and as discussed below with reference to FIG. 8.

In FIG. 7, the IC package 750 is a flip chip package, and includes an example FET 200 in the package substrate 752. The number and location of the example FET(s) 200 in the package substrate 752 of the IC package 750 is simply illustrative, and any number of example FETs 200 (with any suitable structure) may be included in a package substrate 752. In some examples, no FETs may be included in the package substrate 752. The die 756 may take the form of any of the examples of the die 502 discussed herein (e.g., may include any of the examples of the IC device 600). In some examples, the die 756 may include one or more example FETs 200 (e.g., as discussed above with reference to FIG. 5 and FIG. 6); in other examples, the die 756 may not include any FETs 200.

Although the IC package 750 illustrated in FIG. 7 is a flip chip package, other package architectures may be used. For example, the IC package 750 may be a ball grid array (BGA) package, such as an embedded wafer-level ball grid array (eWLB) package. In another example, the IC package 750 may be a wafer-level chip scale package (WLCSP) or a panel fanout (FO) package. Although a single die 756 is illustrated in the IC package 750 of FIG. 7, an IC package 750 may include multiple dies 756 (e.g., with one or more of the multiple dies 756 coupled to the example FET(s) 200 included in the package substrate 752). An IC package 750 may include additional passive components, such as surface-mount resistors, capacitors, and inductors disposed on the first face 772 or the second face 774 of the package substrate 752. More generally, an IC package 750 may include any other active or passive components known in the art.

Figure 8:
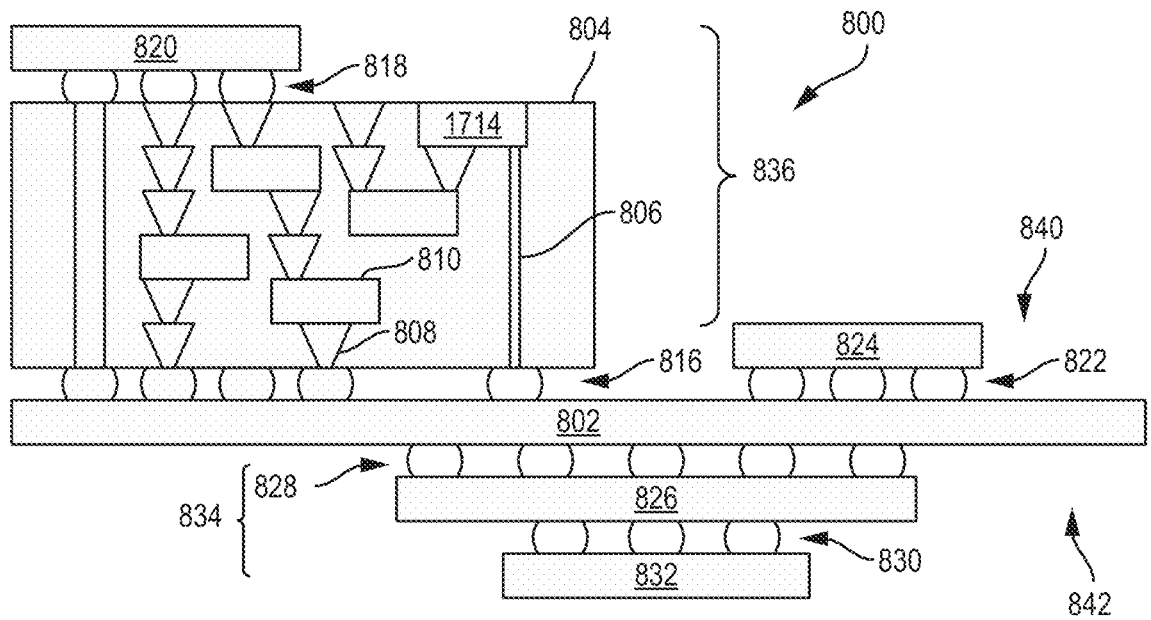
FIG. 8 is a cross-sectional side view of an IC device assembly that may include an FET, such as the example FET of FIG. 2, in accordance with any of the examples disclosed herein.

FIG. 8 is a cross-sectional side view of an IC device assembly 800 that may include one or more IC packages or other electronic components (e.g., a die) including one or more example FETs 200, in accordance with any of the examples disclosed herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802; generally, components may be disposed on one or both faces 840 and 842. Any of the IC packages discussed below with reference to the IC device assembly 800 may take the form of any of the examples of the IC package 750 discussed above with reference to FIG. 7 (e.g., may include one or more of the example FETs 200 in a package substrate 752 or in a die).

In some examples, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other examples, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 502 of FIG. 5), an IC device (e.g., the IC device 600 of FIG. 6), or any other suitable component. Generally, the interposer 804 may spread a connection to a wider pitch or reroute a connection to a different connection. For example, the interposer 804 may couple the IC package 820 (e.g., a die) to a set of BGA conductive contacts of the coupling components 816 for coupling to the circuit board 802. In the example illustrated in FIG. 12, the IC package 820 and the circuit board 802 are attached to opposing sides of the interposer 804; in other examples, the IC package 820 and the circuit board 802 may be attached to a same side of the interposer 804. In some examples, three or more components may be interconnected by way of the interposer 804.

The interposer 804 may be formed of an epoxy resin, a fiberglass-reinforced epoxy resin, an epoxy resin with inorganic fillers, a ceramic material, or a polymer material such as polyimide. In some examples, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art. In some examples, the interposer 804 may include one or more of the example FETs 200.

The IC device assembly 800 may include an IC package 824 coupled to the first face 840 of the circuit board 802 by coupling components 822. The coupling components 822 may take the form of any of the examples discussed above with reference to the coupling components 816, and the IC package 824 may take the form of any of the examples discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the examples of the coupling components 816 discussed above, and the IC packages 826 and 832 may take the form of any of the examples of the IC package 820 discussed above. The package-on-package structure 834 may be configured in accordance with any of the package-on-package structures known in the art.

Figure 9:
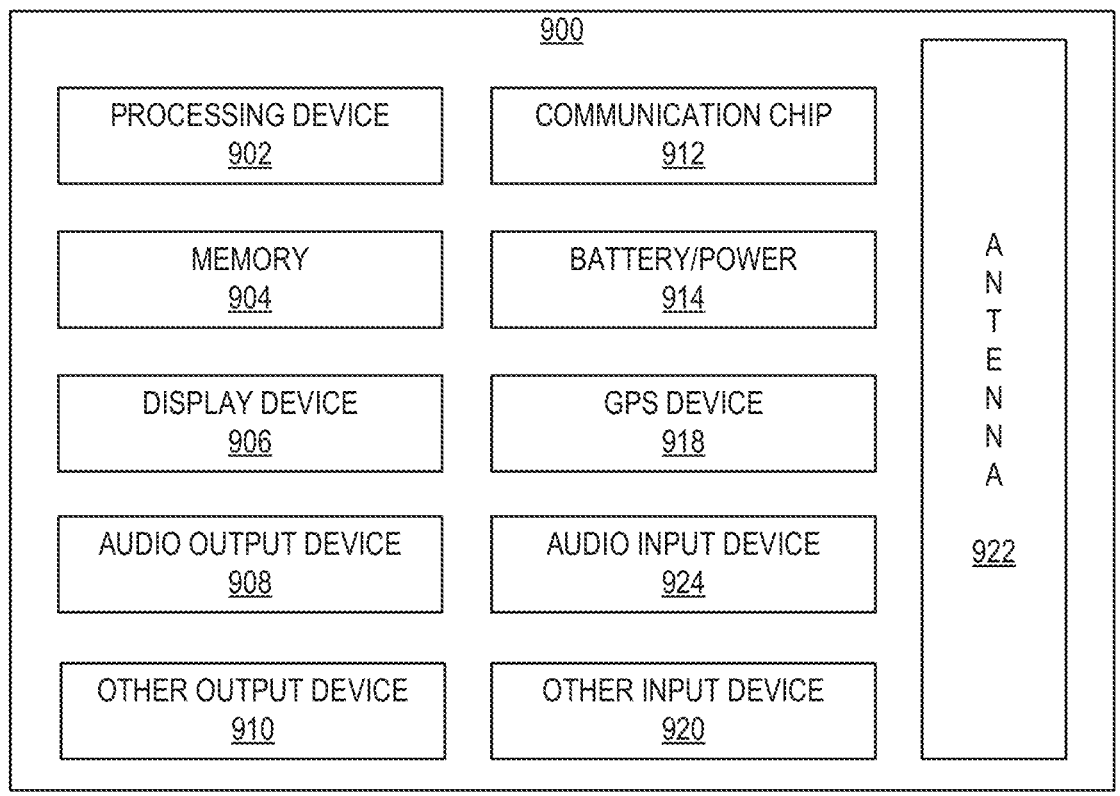
FIG. 9 is a block diagram of an example electrical device that may include an FET, such as the example FET of FIG. 2, in accordance with any of the examples disclosed herein.

FIG. 9 is a block diagram of an example electrical device 900 that may include one or more of the example FETs 200, in accordance with any of the examples disclosed herein. For example, any suitable ones of the components of the electrical device 900 may include one or more of the IC packages 650, IC devices 600, or dies 502 disclosed herein. A number of components are illustrated in FIG. 9 as included in the electrical device 900, but any one or more of these components may be omitted or duplicated, as suitable for the application. In some examples, some or all of the components included in the electrical device 900 may be attached to one or more motherboards. In some examples, some or all of these components are fabricated onto a single system-on-a-chip (SoC) die.

Additionally, in various examples, the electrical device 900 may not include one or more of the components illustrated in FIG. 9, but the electrical device 900 may include interface circuitry for coupling to the one or more components. For example, the electrical device 900 may not include a display device 906, but may include display device interface circuitry (e.g., a connector and driver circuitry) to which a display device 906 may be coupled. In another set of examples, the electrical device 900 may not include an audio input device 924 or an audio output device 908, but may include audio input or output device interface circuitry (e.g., connectors and supporting circuitry) to which an audio input device 924 or audio output device 908 may be coupled.

The electrical device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 904 may include memory that shares a die with the processing device 902. This memory may be used as cache memory and may include embedded dynamic random access memory (eDRAM) or spin transfer torque magnetic random access memory (STT-MRAM).

In some examples, the electrical device 900 may include a communication chip 912 (e.g., one or more communication chips). For example, the communication chip 912 may be configured for managing wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other examples. The electrical device 900 may include an antenna 922 to facilitate wireless communications and/or to receive other wireless communications (such as AM or FM radio transmissions).

In some examples, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some examples, a first communication chip 912 may be dedicated to wireless communications, and a second communication chip 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any device that generates an audible indicator, such as speakers, headsets, or earbuds.

The electrical device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The electrical device 900 may include a GPS device 918 (or corresponding interface circuitry, as discussed above). The GPS device 918 may be in communication with a satellite-based system and may receive a location of the electrical device 900, as known in the art.

The electrical device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The electrical device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 900 may be any other electronic device that processes data.

From the foregoing, it will be appreciated that example FETs, electric devices including one or more such FETs, example systems including one or more such FETs, and methods of fabricating such FETs have been disclosed. In some examples, the dielectric layers in a vertically stacked FET (e.g., an FeFET) are made of borosilicate glass or phososilicate glass. During fabrication, example FETs disclosed herein are heated, which causes boron or phosphorus of the respective BSG or PSG dielectric layers to diffuse into regions of a semiconductor material proximate to the dielectric layers. The doping of certain regions of the semiconductor material with boron or phosphorous reduces a resistance of the semiconductor material in those regions. Example FETs disclosed herein have less series resistance along a vertical stack of the FET, which provides for improved current flow relative to known FETs and enable increase stacking of gate electrodes and insulators without decreasing current flow.

The following paragraphs provide various examples disclosed herein.

Example 1 includes a field-effect transistor including a substrate and a stack above the substrate. The stack includes an insulator and a gate electrode. The example field-effect transistor includes a semiconductor material layer in a cavity in the stack. In the example field-effect transistor, a region of the semiconductor material layer proximate to the insulator is doped with a material of the insulator.

Example 2 includes the field-effect transistor as defined in example 1, wherein the insulator is borosilicate glass and the material is boron.

Example 3 includes the field-effect transistor as defined in example 1, wherein the insulator is phosphosilicate glass and the material is phosphor.

Example 4 includes the field-effect transistor as defined in example 1, wherein the insulator is a first insulator and the stack further includes a second insulator and a recess defined adjacent the gate and between the first insulator and the second insulator.

Example 5 includes the field-effect transistor as defined in example 4, wherein the region is a first region and the semiconductor material layer includes a second region in the recess.

Example 6 includes the field-effect transistor as defined in example 1, further including a ferroelectric material deposited in the cavity.

Example 7 includes the field-effect transistor as defined in example 6, wherein the ferroelectric material is not adjacent the insulator in the cavity.

Example 8 includes a system including a processing circuit including a communications chip; and a field-effect transistor. The field-effect transistor includes a substrate and a stack above the substrate. The stack includes an insulator and a gate electrode. The field-effect transistor includes a semiconductor material layer in a channel in the stack. A region of the semiconductor material layer proximate to the insulator is doped with a material of the insulator.

Example 9 includes the system as defined in example 8, wherein the insulator is borosilicate glass and the material is boron.

Example 10 includes the system as defined in example 8, wherein the insulator is phosphosilicate glass and the material is phosphor.

Example 11 includes the system as defined in example 8, wherein the insulator is a first insulator and the stack further includes a second insulator and a recess is defined adjacent the gate and between the first insulator and the second insulator.

Example 12 includes the system as defined in example 11, wherein the region is a first region and the semiconductor material layer includes a second region in the recess.

Example 13 includes the system as defined in example 8, further including a ferroelectric material deposited in the cavity.

Example 14 includes the system as defined in example 13, wherein the ferroelectric material is not adjacent the insulator in the cavity.

Example 15 includes a field-effect transistor including a substrate; a first insulator; a gate electrode disposed above the first insulator; a second insulator above the gate electrode, the first insulator, the second insulator, and the gate electrode defining a stack. The field-effect transistor includes a recess in a side surface of the gate electrode; a ferroelectric material in the recess; and a semiconductor material layer including a first region in the recess and a second region proximate to the first insulator, the second region doped with a material of the first insulator.

Example 16 includes the field-effect transistor as defined in example 15, wherein the first insulator is one of borosilicate glass or phosphosilicate glass.

Example 17 includes the field-effect transistor as defined in example 15, wherein the first region of the semiconductor material layer is in contact with the ferroelectric material.

Example 18 includes the field-effect transistor as defined in example 15, wherein the second region of the semiconductor material layer is on an edge of the first insulator.

Example 19 includes the field-effect transistor as defined in example 15, wherein the semiconductor material layer includes a third region disposed in the cavity proximate to the second insulator, the third region doped with a material of the second insulator.

Example 20 includes the field-effect transistor as defined in example 15, wherein the gate electrode is indented relative to the first insulator and the second insulator.

Example 21 includes the field-effect transistor as defined in example 15, wherein the semiconductor material layer is vertically oriented relative to the substrate.

Example 22 includes a method to manufacture a field-effect transistor, the method including forming a stack above a substrate, the stack including an insulator and a gate electrode; forming a cavity in the stack; forming a recess in the stack adjacent the gate electrode, the recess in communication with the cavity; depositing a ferroelectric material layer in the cavity along a height of the cavity; depositing a semiconductor material in the recess; forming a drain above the stack; and heating the field-effect transistor.

Example 23 includes the method as defined in example 22, further including removing a portion of the ferroelectric material proximate to the insulator.

Example 24 includes the method as defined in example 23, wherein the removing of the portion of the ferroelectric material includes etching the ferroelectric material.

Example 25 includes the method as defined in example 22, wherein the depositing of the semiconductor material in the recess includes depositing the semiconducting material on the ferroelectric material.

Example 26 includes the method as defined in example 22, wherein the forming of the recess includes etching the gate electrode.

Example 27 includes the method as defined in examples 22 or 26, further including filling the cavity with a dielectric material.

Example 28 includes the method as defined in example 22, wherein the forming of the cavity includes etching the stack.

Example 29 includes the method as defined in example 22, wherein the heating of the field-effect transistor includes annealing the field-effect transistor Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A field-effect transistor comprising:
   a stack above a substrate, the stack comprising a gate electrode vertically between a first insulator and a second insulator;
   a ferroelectric material on a lateral surface of the gate electrode and within a recess vertically between the first insulator and the second insulator, wherein the lateral surface of the gate electrode is adjacent a cavity in the stack, and wherein the ferroelectric material is substantially absent from a lateral surface of the first insulator adjacent the cavity; and
   a semiconductor material layer in the cavity, a first region of the semiconductor material layer on the lateral surface of the first insulator and doped with a dopant material of the first insulator and a second region of the semiconductor material on the ferroelectric material substantially absent the dopant material.

2. The field-effect transistor of claim 1, wherein the insulator comprises borosilicate glass and the dopant material comprises boron.

3. The field-effect transistor of claim 1, wherein the insulator comprises phosphosilicate glass and the dopant material comprises phosphorous.

4. The field-effect transistor of claim 1, wherein at least a portion of the second region of the semiconductor material is within the recess vertically between the first insulator and the second insulator.

5. The field-effect transistor of claim 1, wherein the cavity is substantially filled with a dielectric material.

6. The field-effect transistor of claim 1, further comprising:
   a source and a drain, wherein the stack is between the source and the drain and the semiconductor material layer extends from the source to the drain.

7. The field-effect transistor of claim 1, wherein the ferroelectric material comprises at least one of perovskite oxide, doped hafnium dioxide, lead zirconate titanate, or bismuth ferrite.

8. A system comprising:
   processor circuitry comprising a field-effect transistor, the field-effect transistor comprising:
      a substrate;
      a stack above a substrate, the stack comprising a gate electrode vertically between a first insulator and a second insulator;
      a ferroelectric material on a lateral surface of the gate electrode and within a recess vertically between the first insulator and the second insulator, wherein the lateral surface of the gate electrode is adjacent a cavity in the stack, and wherein the ferroelectric material is substantially absent from a lateral surface of the first insulator adjacent the cavity; and
      a semiconductor material layer in the cavity, a first region of the semiconductor material layer on the lateral surface of the first insulator and doped with a dopant material of the first insulator and a second region of the semiconductor material on the ferroelectric material substantially absent the dopant material; and
   power circuitry coupled to the processor circuitry.

9. The system of claim 8, wherein the insulator comprises borosilicate glass and the dopant material comprises boron.

10. The system of claim 8, wherein the insulator comprises phosphosilicate glass and the material comprises phosphorous.

11. The system of claim 8, wherein at least a portion of the second region of the semiconductor material is within the recess vertically between the first insulator and the second insulator.

12. The system of claim 8, wherein the cavity is substantially filled with a dielectric material.

13. The system of claim 8, further comprising:
   a source and a drain, wherein the stack is between the source and the drain and the semiconductor material layer extends from the source to the drain.

14. A field-effect transistor comprising:
   a first insulator over a substrate;
   a gate electrode above the first insulator;
   a second insulator above the gate electrode, wherein the first insulator, the second insulator, and the gate electrode comprise a stack;
   a recess adjacent a side surface of the gate electrode and vertically between the first insulator and the second insulator;
   a ferroelectric material in the recess, on the side surface of the gate electrode and absent a first side surface of the first insulator and a second side surface of the second insulator; and
   a semiconductor material layer comprising a first region in the recess and a second region on the first side surface of the first insulator, and a third region on the second side surface of the second insulator, the second and third regions doped with a material of the first insulator and the second insulator, respectively.

15. The field-effect transistor of claim 14, wherein the first insulator comprises one of borosilicate glass or phosphosilicate glass.

16. The field-effect transistor of claim 14, wherein the first region of the semiconductor material layer is in contact with the ferroelectric material.

17. The field-effect transistor of claim 14, wherein the second region of the semiconductor material layer is on an edge of the first insulator.

18. The field-effect transistor of claim 14, wherein the cavity is substantially filled with a dielectric material.

19. The field-effect transistor of claim 14, further comprising:
   a source and a drain, wherein the stack is between the source and the drain and the semiconductor material layer extends from the source to the drain.

20. The field-effect transistor of claim 14, wherein the semiconductor material layer is vertically oriented relative to the substrate.

\* \* \* \* \*